(12) United States Patent
Chiang et al.

(10) Patent No.: US 12,356,600 B2
(45) Date of Patent: Jul. 8, 2025

(54) SRAM MEMORY CELL DEVICE COMPRISING FERROELECTRIC ACCESS AND STORAGE TRANSISTORS

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Tzu-Chiang Chen, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/703,931

(22) Filed: Mar. 24, 2022

(65) Prior Publication Data
US 2023/0309285 A1  Sep. 28, 2023

(51) Int. Cl.
| | |
|---|---|
| *G11C 11/00* | (2006.01) |
| *G11C 11/412* | (2006.01) |
| *G11C 14/00* | (2006.01) |
| *H10B 10/00* | (2023.01) |
| *H10D 30/69* | (2025.01) |

(52) U.S. Cl.
CPC ............ *H10B 10/12* (2023.02); *G11C 11/412* (2013.01); *G11C 14/0072* (2013.01); *H10D 30/701* (2025.01)

(58) Field of Classification Search
CPC ... G11C 11/41; G11C 11/412; G11C 14/0072; H10B 10/12; H10B 51/00; H10B 53/00
USPC .......................................................... 365/154
See application file for complete search history.

(56) References Cited

U.S. PATENT DOCUMENTS

| | | | | |
|---|---|---|---|---|
| 5,361,224 | A * | 11/1994 | Takasu ................ | G11C 11/22 365/182 |
| 6,069,816 | A * | 5/2000 | Nishimura ............ | G11C 14/00 257/295 |
| 6,339,238 | B1 * | 1/2002 | Lim ..................... | H10D 84/811 257/295 |
| 6,728,130 | B1 * | 4/2004 | Afghahi ............... | G11C 11/412 365/207 |
| 11,475,941 | B2 * | 10/2022 | Jaiswal ................ | G11C 11/419 |
| 2019/0287617 | A1 * | 9/2019 | Tanaka ................. | G11C 11/21 |
| 2021/0035989 | A1 * | 2/2021 | Lee ..................... | H10D 64/689 |
| 2021/0376108 | A1 * | 12/2021 | Doornbos ............ | H10D 64/689 |
| 2022/0169530 | A1 * | 6/2022 | Choe ................... | C04B 35/62222 |

\* cited by examiner

*Primary Examiner* — Tha-O H Bui
(74) *Attorney, Agent, or Firm* — JCIPRNET

(57) ABSTRACT

A static random-access memory (SRAM) cell including a transistor is introduced. The transistor includes substrate and gate stack structure disposed over the substrate, in which the gate stack structure includes a gate oxide layer, a ferroelectric layer, and a conductive layer. The gate oxide layer is disposed over the substrate; the ferroelectric layer is disposed over the gate oxide layer, wherein the ferroelectric layer has a negative capacitance effect; and the first conductive layer, disposed over the ferroelectric layer. A method of adjusting a threshold voltage of a transistor in the SRAM is also introduced.

20 Claims, 9 Drawing Sheets

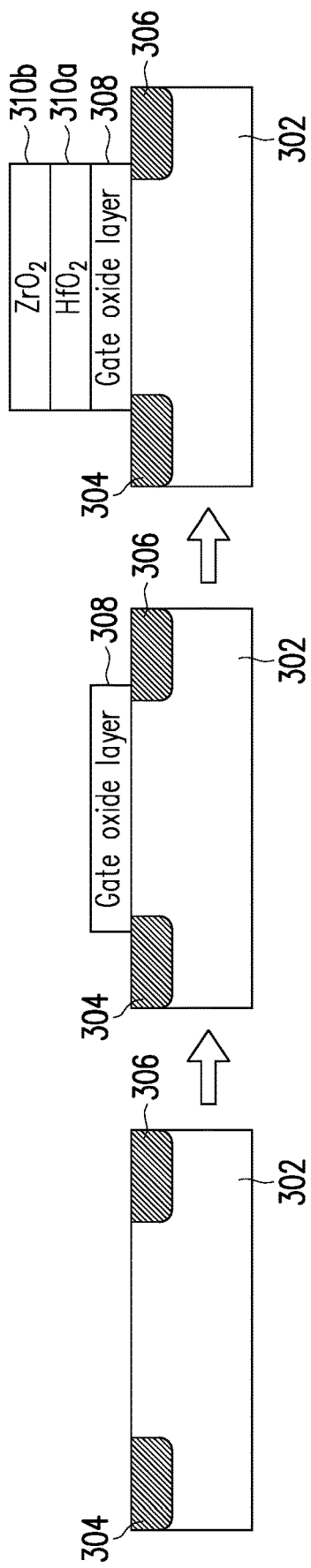
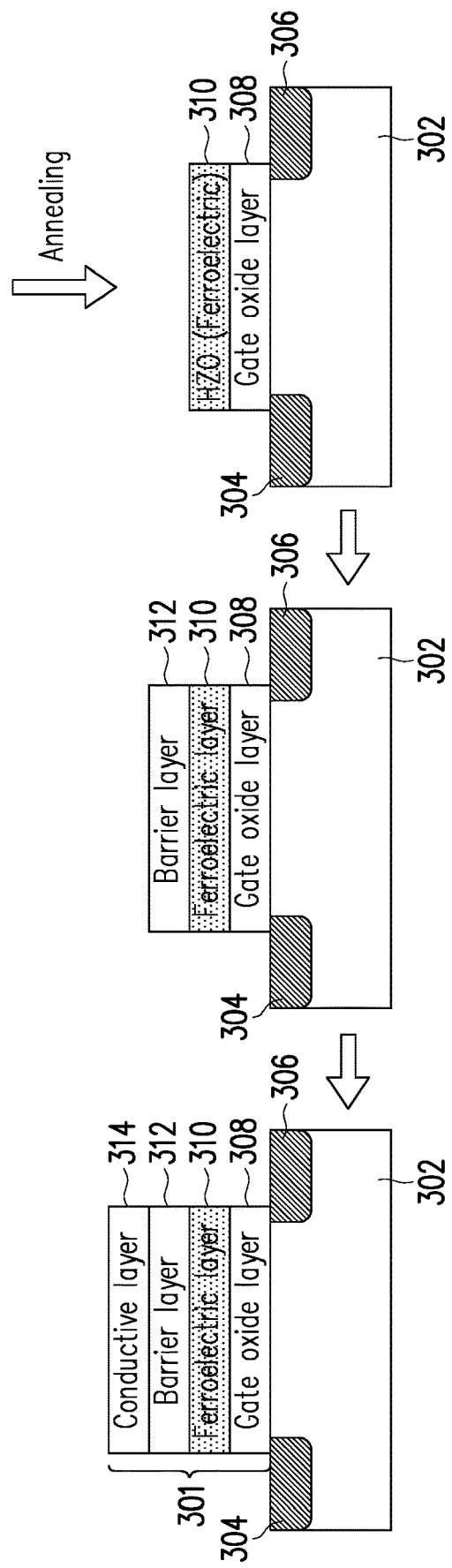
FIG. 3A  FIG. 3B  FIG. 3C
FIG. 3D  FIG. 3E  FIG. 3F

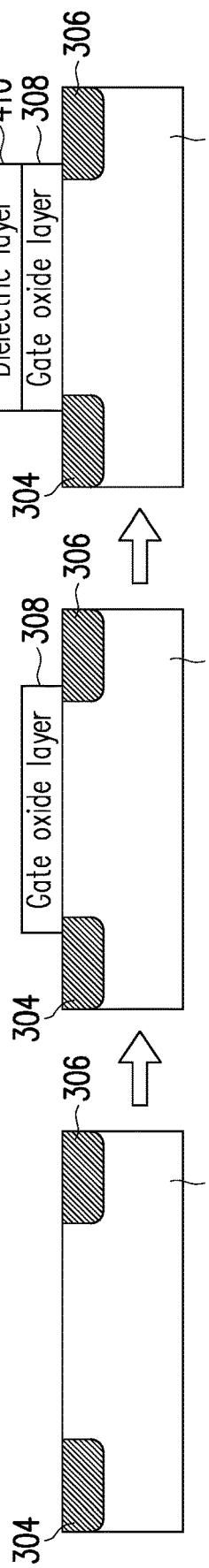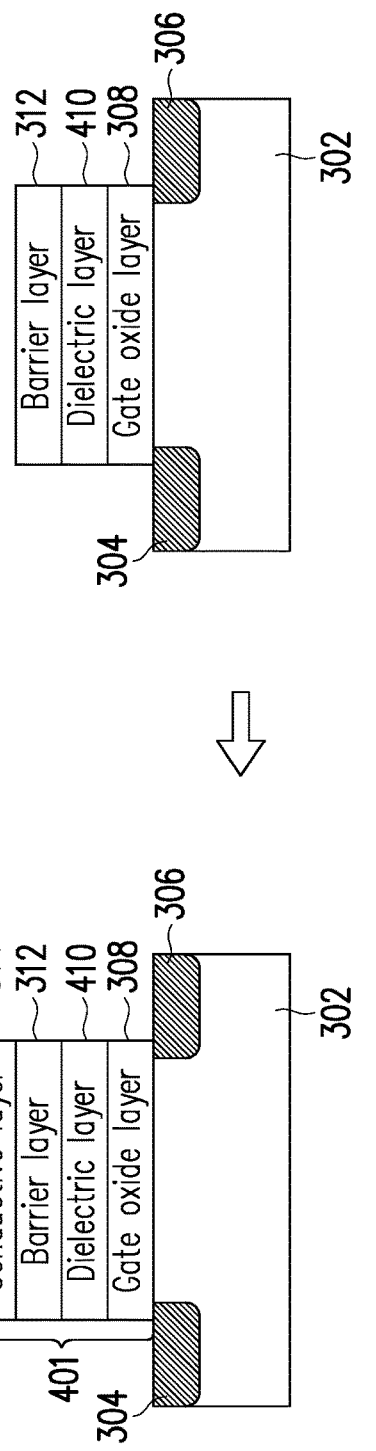

SRAM MEMORY CELL DEVICE COMPRISING FERROELECTRIC ACCESS AND STORAGE TRANSISTORS

BACKGROUND

A typical memory device includes a plurality of memory cells for storing data, in which each memory cell includes at least one transistor. Static random-access memory (SRAM) devices are popular because the SRAM devices operate at a higher speed than a dynamic random-access memory (DRAM) device. The transistor in the existing SRAM cell is designed to have relatively high threshold voltage (Vt) to achieve a low leaking current of the transistor. However, a structure of the transistor results in a low on-current (Ion). In addition, an access transistor and a storage transistor of the SRAM cell have an identical threshold voltage due to same fabrication processes, resulting in limited static noise margin (SNM) and limited flexibility of the SRAM cell after the SRAM cell is fabricated.

As a demand for a high-quality memory device, it has grown a need for a creative design of a transistor and a SRAM device to achieve higher quality memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through 3F are flowchart of a method of fabricating a transistor of a SRAM cell in accordance with some embodiments.

FIG. 4A through 4E are flowchart of a method of fabricating a transistor of a SRAM cell in accordance with some embodiments.

DETAILED DESCRIPTION

Figure 1B:
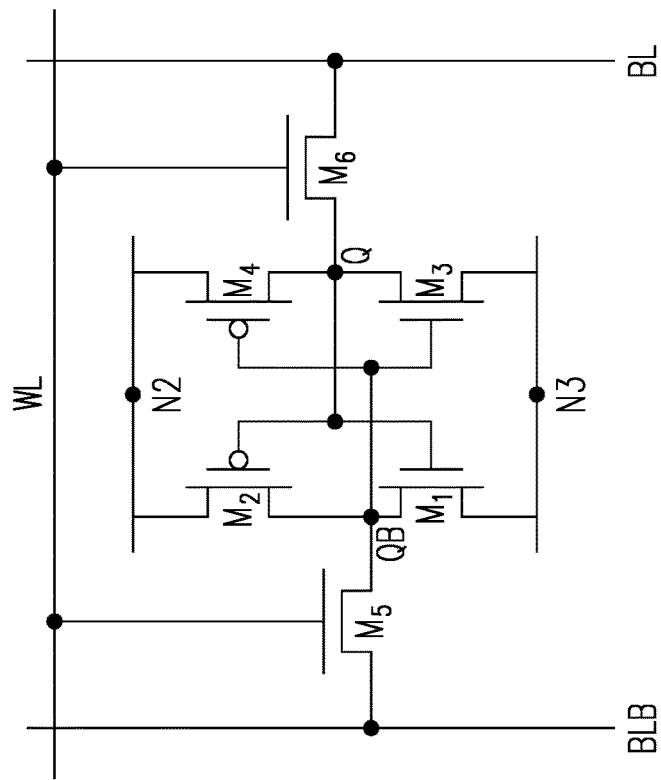
FIG. 1A and FIG. 1B are schematic diagrams of a static random-access memory (SRAM) cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
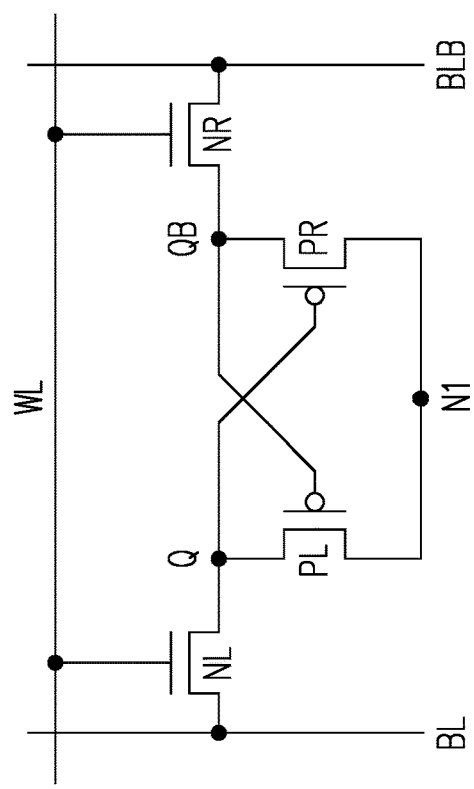

FIG. 1A and FIG. 1B illustrate schematic diagrams of static random-access memory (SRAM) cells 100 and 200 in accordance with some embodiments. In FIG. 1A and FIG. 1B, the SRAM cell 100 is an exemplary four-transistor (4T) SRAM cell, and the SRAM cell 200 is an exemplary six-transistor (6T) SRAM cell. Referring to FIG. 1A, the SRAM cell 100 may include a pair of access transistors NL and NR, a pair of storage transistors PL and PR, and nodes Q and QB. Each of the access transistors NL and NR has a gate terminal, a first terminal and a second terminal, in which the first and second terminals may be source and drain terminals of the access transistors NL and NR. The gate terminals of the access transistors NL and NR may be coupled to the world line WL; the first terminals of the access transistors NL and NR may be coupled to the bit lines BL and BLB; and the second terminals of the access transistors NL and NR may be coupled to the nodes Q and QB of the SRAM cell 100. The storage transistors PL and PR are cross-coupled transistors, in which the gate terminal of the storage transistor PL is coupled to the node QB and the gate terminal of the storage transistor PR is coupled to the node Q. First terminals of the storage transistors PL and PR may be coupled to the nodes Q and QB, respectively; and second terminals of the storage transistors PL and PR may be coupled to a reference node N1. The reference node N1 may receive an operating voltage Vdd in some operations (i.e., a read operation, a write operation or a hold operation) on the SRAM cell 100. In some embodiments, there are leaking currents flowing through the access transistors NL and NR and the storage transistors PL and PR when the access transistors NL and NR and the transistors PL and PR are turned off (in off state). The leakage currents flowing through the access transistors NL and NR are larger than the leaking currents flowing through the storage transistors PL and PR. In this way, the data stored in the SRAM cell 100 is retained even when the SRAM cell 100 is in the off state. In some embodiments, the access transistors NL, NR and the storage transistors PL and PR may be field effect transistors (FETs), the access transistors NL and NR are n-type transistors, and the transistors PL and PR are p-type transistors, but the disclosure is not limited thereto. One of skilled in the art would be appreciated that the types (i.e., n-type or p-type) of the transistors included in the SRAM cell 100 may be changed according to designed requirements.

Referring to FIG. 1B, the SRAM cell 200 may include a pair of access transistors M5, M6, nodes Q and QB, and cross-coupled inverters that are formed by transistors M1, M2, M3 and M4. The transistors M1, M2, M3 and M4 may also be referred to as storage transistor of the SRAM cell 200. Gate terminals of the access transistors M5, M6 may be coupled to the world line WL; first terminals of the access transistors M5 and M6 may be coupled to the bit lines BL and BLB; and second terminals of the access transistors M5 and M6 may be coupled the nodes Q and QB. The nodes Q and QB serve as output nodes of the SRAM cell 200. One of the cross-coupled inverters is formed by the transistors M1 and M2, and another one of the cross-coupled inverters is formed by the transistors M3 and M4. Each of the cross-coupled inverters may include a pull-up transistor and a pull-down transistor. For example, the transistors M2 and M4 are also referred to as pull-up transistors of the SRAM cell 200, and the transistors M1 and M3 are also referred to as pull-down transistors of the SRAM cell 200. The SRAM cell 200 may further include reference nodes N2 and N3, in which reference voltages (i.e., an operating voltage Vdd and a ground voltage GND) are applied to the nodes N2 and N3 in different operations of the SRAM cell 200. For example, the operating voltage Vdd is applied to the node N2 and the ground voltage GND is applied to the node N3 in some operations on the SRAM cell 200. In some embodiments, the transistors M1 through M6 are FETs, in which the transistors M1, M3, M5 and M6 are n-type transistors and the transistors M2 and M4 are p-type transistors. It is noted that the types of the transistors M1 though M6 in the SRAM cell 200 may be changed according to designed requirements.

Figure 2A:
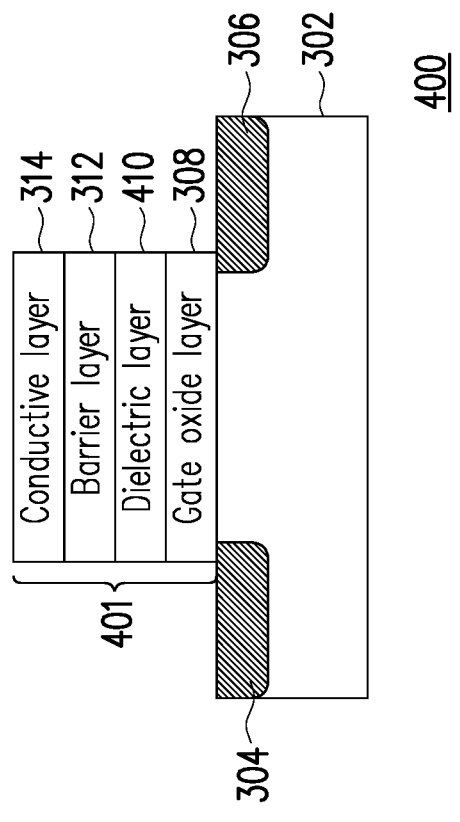
FIGS. 2A and 2B are sectional views of transistors in a SRAM cell in accordance with some embodiments.

FIG. 2A illustrates a sectional view of a transistor 300 in accordance with some embodiments. The transistor 300 may be any one of the transistors included in the SRAM cell 100 shown in FIG. 1 or the SRAM cell 200 shown in FIG. 2. The transistor 300 may include a semiconductor substrate 302, source and drain regions 304, 306, and a gate stack structure 301 that is disposed over the substrate 302. The source and drain regions 304 are doped with suitable dopants. The source and drain regions 304 and 306 are coupled to the source terminal and the drain terminal of the transistor 300. The gate stack structure 301 may include a gate oxide layer 308, a ferroelectric layer 310, a barrier layer 312 and a conductive layer 314, in which the gate oxide layer 308 is disposed over the semiconductor substrate 302, the ferroelectric layer 310 is disposed over the gate oxide layer 308, the barrier layer 312 is disposed over the ferroelectric layer 310, and the conductive layer 314 is disposed over the barrier layer 312. Processes for fabricating the transistor 300 will be described in association with FIG. 3A through FIG. 3F.

Figure 2B:
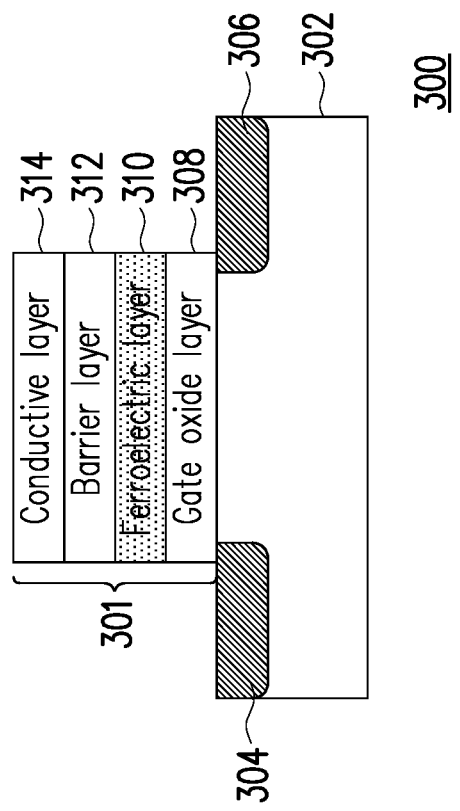

FIG. 2B illustrates a sectional view of a transistor 400 in accordance with some embodiments. The transistor 400 may be any one of the transistors in the SRAM cell 100 shown in FIG. 1 or in the SRAM cell 200 shown in FIG. 2. A difference between the transistor 300 shown in FIG. 2A and the transistor 400 shown in FIG. 2B is that the gate stack structure 401 of the transistor 400 includes a dielectric layer 410 instead of the ferroelectric layer 310 in the gate stack structure 301 of the transistor 300. Processes for fabricating the transistor 400 will be described in association with FIG. 4A through FIG. 4E.

FIG. 3A through FIG. 3F illustrate processes for fabricating the transistor 300 in accordance with some embodiments. Referring to FIG. 3A, the semiconductor substrate 302 with the source region 304 and the drain region 306 formed therein is provided. The material of the semiconductor substrate 302 may include, for example, Si, SiGe, Ge, or III-V (InP, GaAs, AlAs, InAs, InAlAs, InGaAs, InSb, GaSb, InGaSb). The source portion 304 and the drain portion 306 may be doped with n-type or p-type dopants to generate n-type doping regions or p-type doping regions.

Referring to FIG. 3B, the gate oxide layer 308 that is made of high-K material is disposed over the semiconductor substrate 302. A chemical vapor deposition (CVD) or any other suitable techniques may be used to form the gate oxide layer 308 over the semiconductor substrate 302. The high-K material of the gate oxide layer 308 may include, for example, $GeO_2$, $HfO_2$, $ZrO_2$, $HfZrO_2$, $Ga_2O_3$, $Gd_2O_3$, $TaSiO_2$, $Al_2O_3$, or $TiO_2$.

Referring to FIG. 3C, sub-layers 310a and 310b are provided over the gate oxide layer 308. The sub-layer 310a is provided over the gate oxide layer 308, and the sub-layer 310b is provided over the sub-layer 310a. In some embodiments, the material of the sub-layer 310a includes hafnium oxide ($HfO_2$), and the material of the sub-layer 310b includes Zirconium dioxide ($ZrO_2$).

Referring to FIG. 3D, the sub-layers 310a and 310b are subjected to an annealing process to generate the ferroelectric layer 310. The material of the ferroelectric layer 310 includes $Hf_xZr_{1-x}O_2$, in which x in a range from 0.3 to 0.5. In some embodiments, a thickness of the ferroelectric layer 310 is in the range from 5 nm to 20 nm, and a temperature of the annealing process is from 600 to 700 degree Celsius. It is noted that the disclosure does not intend to limit the material, conditions and parameters of the ferroelectric layer 310, sub-layers 310a and 310b. One of skilled in the arts would appreciate that alternative material and conditions may be used to generate the ferroelectric layer 310 in the gate stack structure of the transistor.

Referring to FIG. 3E and FIG. 3F, a barrier layer 312 is disposed above the ferroelectric layer 310, and a conductive layer 314 is disposed above the barrier layer 312. The barrier layer 312 functions as a diffusion barrier layer to eliminate the diffusion between the ferroelectric layer 310 and the conductive layer 314 for better device performance. In some embodiments, the conductive layer 314 includes a metallic material such as silver, aluminum, copper, tungsten, nickel, alloys thereof, or metal compound. The conductive layer 314 may be formed using physical vapor deposition (PVD), plating, a combination thereof, or other suitable technology. The transistor (i.e., transistor 300 in FIG. 2A) with the ferroelectric layer 310 in the gate stack structure 301 is formed through the processes performed in FIG. 3A through FIG. 3F. The gate stack structure 301 may form a negative capacitance effect of the transistor 300. As the formation of the negative capacitance effect, the SRAM cell 300 may have high on-current and high threshold voltage. In addition, the negative capacitance effect of the transistor 300 may also contribute to low sub-threshold swing and low leaking current of the transistor 300.

FIG. 4A through FIG. 4E illustrate processes of fabricating the transistor 400 in accordance with some embodiments. The processes shown in FIG. 4A and FIG. 4B are same as the processes shown in FIG. 3A, FIG. 3B, thus the detailed description about the processes in FIG. 4A and FIG. 4B are omitted hereafter. After the gate oxide layer 308 is formed above the semiconductor substrate 302 as shown in FIG. 4B, a dielectric layer 410 is formed on above the gate oxide layer 308 (FIG. 4C). The material of the dielectric layer 410 may include a high-K material such as hafnium oxide ($HfO_2$), but the disclosure does not intend to limit the material of dielectric layer 410. In FIG. 4D and FIG. 4E, a barrier layer 312 is disposed above the dielectric layer 410, and a conductive layer 314 is disposed above the barrier layer 312. The barrier layer 312 functions as a diffusion barrier layer to eliminate the diffusion between the dielectric layer 410 and the conductive layer 314 for better device performance. After the processes FIG. 4A through FIG. 4E are performed, the transistor with the same structure as the transistor 400 shown in FIG. 2B is formed.

Figure 5:
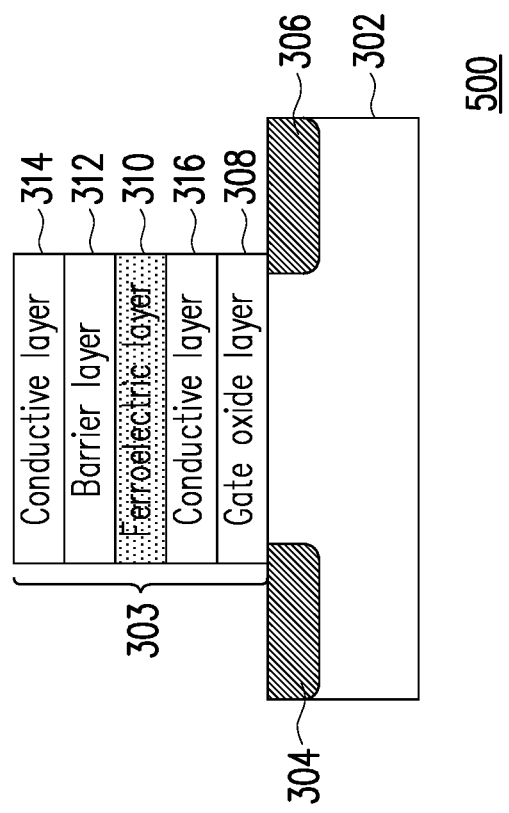
FIG. 5 is a sectional view of a transistor in accordance with some embodiments.

FIG. 5 illustrates a sectional view of a transistor 500 in accordance with some embodiments. Referring to FIG. 2A and FIG. 5, a difference between the transistors 500 shown in FIG. 5 and the transistor 300 shown in FIG. 2A is that a gate stack structure 303 of the transistor 500 further include a conductive layer 316 disposed between the gate oxide layer 308 and the ferroelectric layer 310. The conductive layer 316 may be similar to the conductive layer 314 in terms of composition and formation. The gate stack structure 303 of the transistor 500 may form a negative capacitance effect of the transistor 500. As a result, both of the threshold voltage and the on-current of the transistor 500 are high, and the sub-threshold swing (SS) of the transistor 500 is low.

Figure 6:
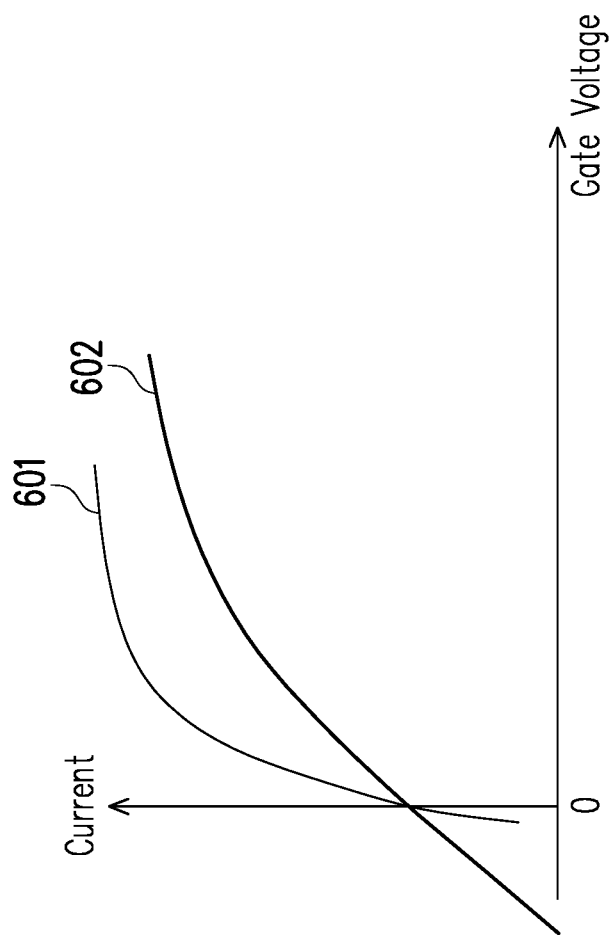
FIG. 6 is a diagram illustrating current-voltage (IV) curves of transistors in accordance with some embodiments.

FIG. 6 illustrates a diagram of an IV curve 601 of a transistor (i.e., transistor 300 in FIG. 2A) with a negative capacitance effect and an IV curve 602 of a transistor (i.e., transistor 400 in FIG. 2B) without negative capacitance effect in accordance with some embodiments. The horizontal axis of the diagram indicates a gate voltage of the transistor, and the vertical axis of the diagram indicates a drain current flowing through the transistor. As shown in FIG. 6, the IV curve 601 is located above the IV curve 601. As such, the on-current of the transistor (i.e., transistor 300 in FIG. 2A) with the negative capacitance effect is higher than the on-current of the transistor (i.e., transistor 400 in FIG. 2B) without the negative capacitance effect. In other words, the negative capacitance effect of the transistor (i.e., transistor 300) may enhance the on-current of the transistor. In this way, the transistor with the negative capacitance effect may have the high on-current and high threshold voltage.

In some embodiments, at least one of the transistors in the SRAM cell 100 as shown in FIG. 1A has the structure of the transistor 200 shown in FIG. 2A. Referring to FIG. 1A and FIG. 2A, the storage transistors PL and PR of the SRAM cell 100 may have the same structure as the transistor 200 shown in FIG. 2A. In other words, the gate structures of the storage transistors PL and PR may include ferroelectric layers (i.e., ferroelectric layer 310 in FIG. 2A) to form the negative capacitance effect. As the storage transistors PL and PR have the negative capacitance effect, both of the on-currents and the threshold voltages of the storage transistors PL and PR are relatively high. In addition, the negative capacitance effect of the storage transistors PL and PR may also improve the sub-threshold swing (SS). In some embodiments, the SS of the transistors PL and PR is less than 60 mV/dec. In some embodiments, the storage transistors PL and PR are p-type metal-oxide-semiconductor (MOS) transistors which have relative low leakage current. In these embodiments, the transistors PL and PR of the SRAM cell 100 may have low leakage currents, low sub-threshold swing, high on-currents and high threshold voltages. These SRAM cell 100 may be applicable for low power SRAM devices. In addition, as the transistors with the negative capacitance effect may achieve high on-current and high threshold voltage, there is no need to design multi-fin transistors for purposes of achieving high on-current and high threshold voltage. Accordingly, a density and a static noise margin (SNM) of the SRAM cell are improved.

In some embodiments, at least one of the transistors in the SRAM cell 200 as shown in FIG. 1B has the same structure as the transistor 200 shown in FIG. 2A. For example, at least one of the pull-up transistors M2, M4 or at least one of the pull-down transistors M1 and M3 may have same structure as the transistor 200 shown in FIG. 2A. In other words, at least one of the transistors M1, M2, M3 and M4 includes a ferroelectric layer (i.e., ferroelectric layer 310 in FIG. 2A) which forms the negative capacitance effect. The transistors M1, M2, M3 and M4 of the SRAM cell 100 may have low leakage currents, low sub-threshold swing, high on-currents and high threshold voltages.

Figure 7:
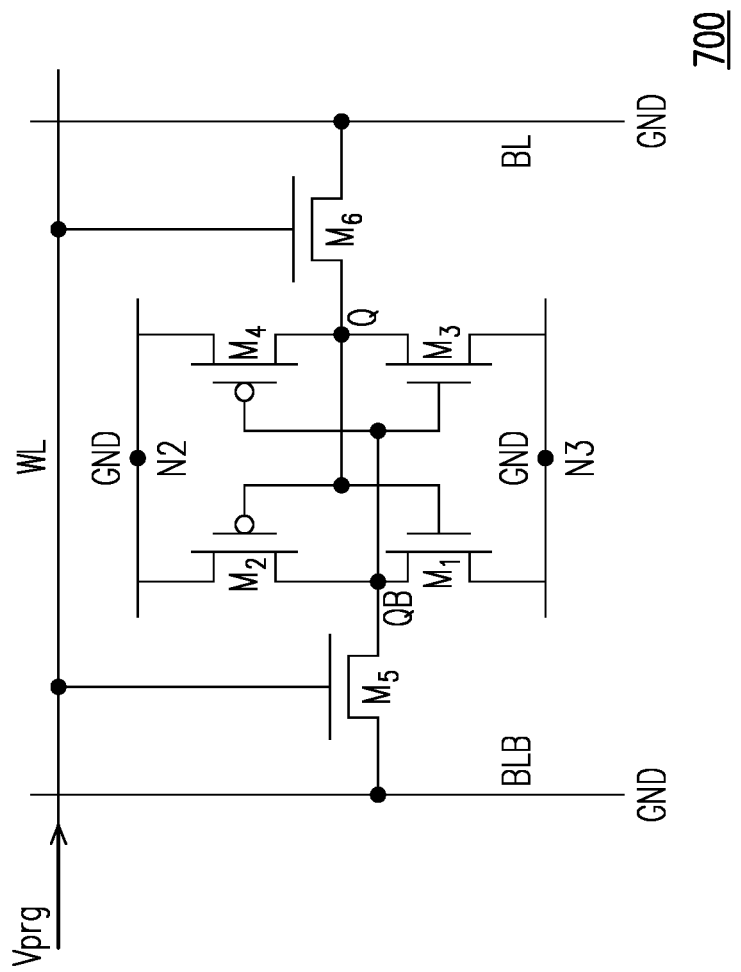
FIG. 7 is a schematic diagram illustrating voltages applied to a SRAM cell in a pre-program operation in accordance with some embodiments.

In some embodiments, a pre-program operation may be performed on a SRAM cell (i.e., SRAM cell 300 in FIG. 2A) to program the ferroelectric layer (i.e., ferroelectric layer 310 in FIG. 2A), thereby adjusting the threshold voltage of at least one transistor of the SRAM cell. FIG. 7 illustrates voltages applied to a 6T SRAM cell 700 in the pre-program operation to adjust threshold voltages of the access transistors M5 and M6 in accordance with some embodiments. In some embodiments, each of the access transistors M5 and M6 has the same structure as the transistor 300 shown in FIG. 2A. In other words, each of the access transistors M5 and M6 includes a ferroelectric layer (i.e., ferroelectric layer 310) in its gate stack structure. The circuit structure of the SRAM cell 700 shown in FIG. 7 is same as the circuit structure of the SRAM cell 200 shown in FIG. 1B, thus the description about the circuit structure of the SRAM 700 is omitted hereafter.

In the pre-program operation, a bias voltage Vprg is applied to the word line WL of the SRAM cell 700, while the ground voltage GND is applied to the bit lines BL and BLB of the SRAM cell 700. Meanwhile, the ground voltage GND is applied to the reference nodes N2 and N3 of the SRAM cell 700 during the pre-program operation. In some embodiments, the bias voltage Vprg may be greater than the operating voltage Vdd of the SRAM cell 700. For example, a voltage level of the bias voltage Vprg may be double or triple or multiple times the level of the operating voltage Vdd of the SRAM 700. In this way, the ferroelectric layer of the access transistors M5 and M6 are programed, and the threshold voltages of the access transistors M5 and M6 are adjustable. As a result of the pre-program operation, the threshold voltages of the access transistors M5 and M6 may be different from the threshold voltages of the pull-up transistors M2, M4, and the threshold voltages of the pull-down transistors M1, M3 of the SRAM cell 700. In an example, before performing the pre-program operation on the SRAM cell 700, the threshold voltages of the access transistors M5 and M6 are substantially identical to the threshold voltages of the pull-down transistors M1 and M3, because these transistors are fabricated under same fabricating processes. After performing the pre-program operation on the SRAM cell 700, the threshold voltages of the access transistors M5 and M6 may be lower than the threshold voltages of the pull-down transistors M1 and M3. In some embodiments, the threshold voltages of the access transistors M5 and M6 are greater than the threshold voltage of the pull-up transistors M2 and M4, and the threshold voltages of the access transistors M5 and M6 are smaller than the threshold voltages of the pull-down transistors M1 and M3.

Figure 8:
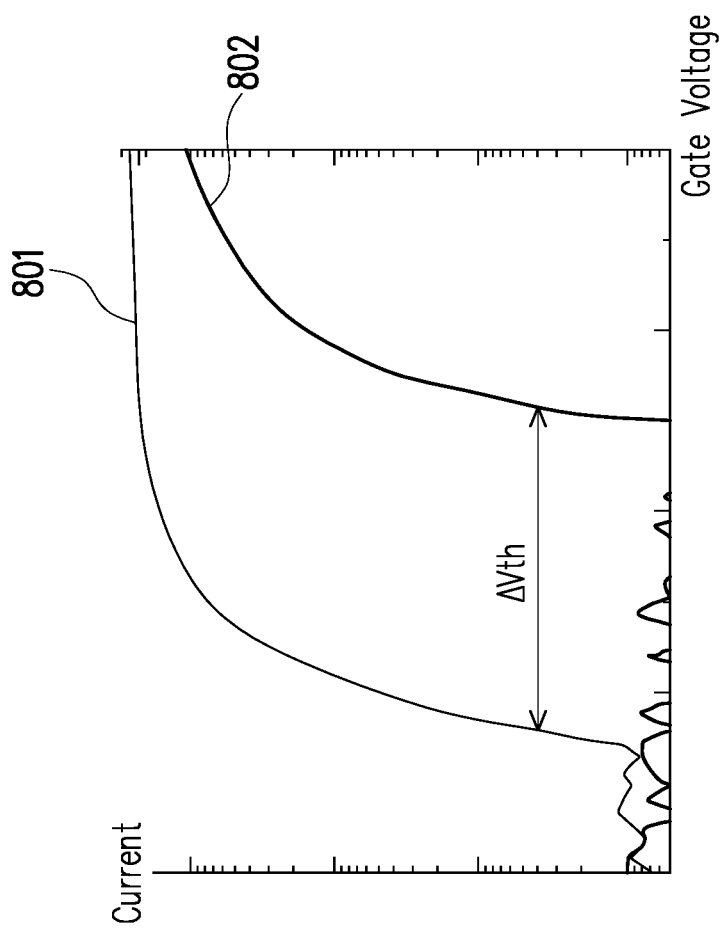
FIG. 8 is a diagram illustrating IV curves of a transistor before and after a pre-program operation in accordance with some embodiments.

FIG. 8 is a diagram illustrating IV curves 801 and 802 of a transistor (i.e., access transistor M5 or M6 in FIG. 7) in a SRAM cell (i.e., SRAM cell 700 in FIG. 7) before and after the pre-program operation in accordance with some embodiments. The horizontal axis indicates the gate voltage applied to the gate terminal of the transistor, and the vertical axis indicates the drain current flowing through the transistor. The IV curve 802 is the IV curve of the transistor before the pre-program operation is performed, and the IV curve 802 is the IV curve of the transistor after the pre-program operation is performed. Referring to FIG. 7 and FIG. 8, after the pre-program operation is performed on the transistor (i.e., access transistor M5 or M6), the IV curve 802 is shifted to be the IV curve 801. As shown in FIG. 7, the threshold voltage of the transistor (i.e., access transistor M5 or M6) is shifted by ΔVth after the pre-program operation is performed. In this way, the threshold voltage of transistors in the SRAM cell is adjustable by performing the pre-program operation on the SRAM cell. A capability of adjusting the threshold voltage of transistors in SRAM cell may improve the SNM of operations performed on the SRAM cell. In addition, capability of adjusting the threshold voltage of transistors in SRAM cell may further improve a flexibility of SRAM performance after the fabrication processes.

Figure 9:
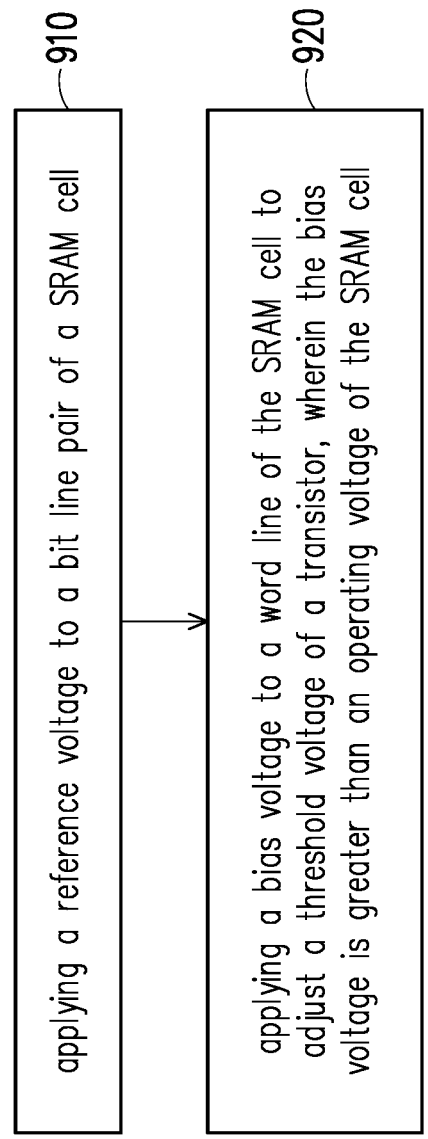
FIG. 9 is a flowchart diagram illustrating a method of adjusting a threshold voltage of a transistor in accordance with some embodiments.

FIG. 9 illustrates a flowchart diagram of a method for adjusting a threshold voltage of a transistor in a SRAM cell in accordance with some embodiments. In block 910, a reference voltage is applied to to a bit line pair of the SRAM cell. In some embodiments, the reference voltage may be the ground voltage GND. In block 920, a bias voltage (i.e., the bias voltage Vprg) is applied to a word line of the SRAM cell to adjust the threshold voltage of the transistor, wherein the bias voltage is greater than an operating voltage of the SRAM cell. Referring to FIG. 2A, FIG. 7 and FIG. 9, the application of the reference voltage and the bias voltage to the bit lines and the word line of the SRAM cell may program the ferroelectric layer (i.e., ferroelectric layer 310 in FIG. 2A), such that the threshold voltages of the transistor (i.e., access transistor M5 or M6) are adjustable.

In some embodiments, a gate stack structure of at least one transistor in a SRAM cell includes a ferroelectric layer which may form a negative capacitance effect on the transistor. As the formation of the negative capacitance effect, the at least one transistor in the SRAM cell may have high on-current and high threshold voltage. In addition, the negative capacitance effect of the at least one transistor may also contribute to low sub-threshold swing and low leaking current of the transistor. As such, the SRAM cell may be applicable for low power consumption applications. In addition, as the transistors the SRAM cell may have high on-current and high threshold voltage without the needs of multi-fin design, the density of the SRAM cell is enhanced and the SNM of the SRAM cell is improved. Furthermore, a pre-program operation may be performed on the SRAM cell to program the ferroelectric layer of the transistor of the SRAM cell. As such, the threshold voltage of the transistor of the SRAM cell is adjustable. As a result, the SNM of the SRAM cell is further improved, and flexibility of SRAM performance after the fabricating processes are enhanced.

In some embodiments, a static random-access memory (SRAM) device including a transistor is introduced. The transistor includes substrate and gate stack structure disposed over the substrate, in which the gate stack structure includes a gate oxide layer, a ferroelectric layer, and a conductive layer. The gate oxide layer is disposed over the substrate; the ferroelectric layer is disposed over the gate oxide layer, wherein the ferroelectric layer has a negative capacitance effect; and the first conductive layer, disposed over the ferroelectric layer.

In some embodiments, a transistor of a static random-access memory (SRAM) cell is introduced. The transistor includes substrate and gate stack structure disposed over the substrate, in which the gate stack structure includes a gate oxide layer, a ferroelectric layer, and a conductive layer. The gate oxide layer is disposed over the substrate; the ferroelectric layer is disposed over the gate oxide layer, wherein the ferroelectric layer has a negative capacitance effect; and the first conductive layer, disposed over the ferroelectric layer. A threshold voltage of the transistor is adjustable by performing a pre-program operation, wherein a bias voltage that is applied to the gate stack structure of the transistor during the pre-program operation is larger than an operating voltage of the transistor.

In some embodiments, a method of adjusting a threshold voltage of a transistor of static random-access memory (SRAM) cell is introduced. The method includes steps of applying a reference voltage to a bit line pair of the SRAM cell; and applying a bias voltage to a word line of the SRAM cell to adjust the threshold voltage of the transistor, wherein the bias voltage is larger than an operating voltage of the SRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random-access memory (SRAM) cell, comprising:
   a pair of pull-up transistors, connected to a first reference node;
   a pair of pull-down transistors, connected to a second reference node; and
   a plurality of access transistors, wherein each of the access transistors comprises:
      a substrate;
      a source, coupled to a first terminal of one of the pair of pull-up transistors and a second terminal of one of the pair of pull-down transistors;
      a drain, coupled to a bit line;
      a gate stack structure, disposed over the substrate, coupled to a word line, wherein the gate stack structure comprises:
         a gate oxide layer, disposed over the substrate;
         a ferroelectric layer, disposed over the gate oxide layer, wherein the ferroelectric layer has a negative capacitance effect; and
         a first conductive layer, disposed over the ferroelectric layer,
      wherein a threshold voltage of the access transistor is changed from a first threshold voltage to a second threshold voltage by biasing to the gate stack structure of the access transistor with a bias voltage greater than an operating voltage of the access transistor, biasing the source or the drain of the access transistor with a ground voltage, and biasing the first reference node and the second reference node with the ground voltage during a pre-program operation,
   the access transistor is turned on by biasing the gate stack structure of the access transistor with the operating voltage before and after the pre-program operation,
   the threshold voltage of the access transistor is greater than threshold voltages of the pair of pull-up transistors and the threshold voltage of the access transistor is smaller than threshold voltages of the pair of pull-down transistors regardless of logic state stored in the SRAM cell,
   the threshold voltage of the access transistor is a minimum voltage between a gate of the access transistor and the source of the access transistor to form a conducting path between the source and the drain of the access transistor, and the threshold voltage of the access transistor is independent from the logic state stored in the SRAM cell.

2. The SRAM cell of claim 1, wherein
the ferroelectric layer is formed by performing an annealing process with a temperature in a range from 600 to 700 degree Celsius.

3. The SRAM cell of claim 1, wherein
a ferroelectric material of the ferroelectric layer includes $Hf_xZr1-xO2$, wherein x is in a range from 0.3 to 0.5.

4. The SRAM cell of claim 1, wherein
a thickness of the ferroelectric layer is in a range from 5 to 20 nm.

5. The SRAM cell of claim 1, wherein
a leakage current of the access transistor is larger than a leakage current of a storage transistor of the SRAM cell.

6. The SRAM cell of claim 1, wherein the gate stack structure further comprises:
a second conductive layer, disposed between the gate oxide layer and the ferroelectric layer.

7. The SRAM cell of claim 1, wherein
the access transistor and a storage transistor of the SRAM cell are fabricated by same fabrication processes, and
the threshold voltage of the access transistor is same as the threshold voltages of the pair of pull-up transistors and the threshold voltages of the pair of pull-down transistors before the pre-program operation is performed.

8. The SRAM cell of claim 1, wherein the gate stack structure further comprises a barrier layer, sandwiched between the ferroelectric layer and the first conductive layer.

9. The SRAM cell of claim 8, wherein the barrier layer directly contacts the ferroelectric layer and the first conductive layer.

10. An access transistor of a static random-access memory (SRAM) cell which comprises a pair of pull-up transistors connected to a first reference node and a pair of pull-down transistors connected to a second reference node, the access transistor comprises:
a substrate;
a source, coupled to a first terminal of one of the pair of pull-up transistors and a second terminal of one of the pair of pull-down transistors;
a drain, coupled to a bit line;
a gate stack structure, disposed over the substrate, coupled to a word line, wherein the gate stack structure comprises:
a gate oxide layer, disposed over the substrate;
a ferroelectric layer, disposed over the gate oxide layer, wherein the ferroelectric layer has a negative capacitance effect; and
a first conductive layer, disposed over the ferroelectric layer,
wherein a threshold voltage of the access transistor is changed from a first threshold voltage to a second threshold voltage by biasing to the gate stack structure of the access transistor with a bias voltage greater than an operating voltage of the access transistor, biasing the source or the drain of the access transistor with a ground voltage, and biasing the first reference node and the second reference node with the ground voltage during a pre-program operation,
the access transistor is turned on by biasing the gate stack structure of the access transistor with the operating voltage before and after the pre-program operation,
the threshold voltage of the access transistor is greater than threshold voltages of the pair of pull-up transistors and the threshold voltage of the access transistor is smaller than threshold voltages of the pair of pull-down transistors regardless of logic state stored in the SRAM cell, the threshold voltage of the access transistor is a minimum voltage between a gate of the access transistor and the source of the access transistor to form a conducting path between the source and the drain of the access transistor, and the threshold voltage of the access transistor is independent from the logic state stored in the SRAM cell.

11. The access transistor of claim 10, wherein
the ferroelectric layer is formed by performing an annealing process with a temperature in a range from 600 to 700 degree Celsius.

12. The access transistor of claim 10, wherein
a ferroelectric material of the ferroelectric layer includes $Hf_xZr1-xO2$, wherein x is in a range from 0.3 to 0.5.

13. The access transistor of claim 10, wherein
a thickness of the ferroelectric layer is in a range from 5 to 20 nm.

14. The access transistor of claim 10, wherein
the access transistor and a storage transistor of the SRAM cell are fabricated by same fabrication processes, and
the threshold voltage of the access transistor is same as the threshold voltages of the pair of pull-up transistors and the threshold voltages of the pair of pull-down transistors before the pre-program operation is performed.

15. The access transistor of claim 10, wherein the gate stack structure further comprises a barrier layer, sandwiched between the ferroelectric layer and the first conductive layer.

16. The access transistor of claim 15, wherein the barrier layer directly contacts the ferroelectric layer and the first conductive layer.

17. A method of changing a threshold voltage of an access transistor of a static random-access memory (SRAM) cell which comprises a pair of pull-up transistors connected to a first reference node and a pair of pull-down transistors connected to a second reference node and the access transistor, the access transistor comprises a substrate, a source coupled to a first terminal of one of the pair of pull-up transistors and a second terminal of one of the pair of pull-down transistors, a drain and a gate stack structure, the method comprising:
biasing the source or the drain of the access transistor with a ground voltage during a pre-program operation; and
biasing the gate stack structure of the access transistor with a bias voltage greater than an operating voltage of the access transistor during the pre-program operation; and
biasing the first reference node and the second reference node with the ground voltage during the pre-program operation,
wherein the access transistor is turned on by biasing the gate stack structure of the access transistor with the operating voltage before and after the pre-program operation, the threshold voltage of the access transistor is greater than threshold voltages of the pair of pull-up transistors and the threshold voltage of the access transistor is smaller than threshold voltages of the pair of pull-down transistors regardless of logic state stored in the SRAM cell, the threshold voltage of the access transistor is a minimum voltage between a gate of the access transistor and the drain of the access transistor to form a conducting path between the source and the drain of the access transistor, and the threshold voltage of the access transistor is independent from the logic state stored in the SRAM.

18. The method of claim 17, wherein the gate stack structure of the access transistor comprises:
   a gate oxide layer, disposed over the substrate;
   a ferroelectric layer, disposed over the gate oxide layer, wherein the ferroelectric layer has a negative capacitance effect; and
   a first conductive layer, disposed over the ferroelectric layer.

19. The method of claim 17, wherein
   the access transistor and a storage transistor of the SRAM cell are fabricated by same fabrication processes, and
   the threshold voltage of the access transistor is same as the threshold voltages of the pair of pull-up transistors and the threshold voltages of the pair of pull-down transistors before the pre-program operation is performed.

20. The method of claim 17, wherein the gate stack structure further comprises a barrier layer, sandwiched between the ferroelectric layer and the first conductive layer, and the barrier layer directly contacts the ferroelectric layer and the first conductive layer.

* * * * *